(12) United States Patent
Wang et al.

(10) Patent No.: US 11,876,282 B2
(45) Date of Patent: Jan. 16, 2024

(54) ASSEMBLY METHOD AND AP DEVICE

(71) Applicant: Huawei Technologies Co., Ltd., Shenzhen (CN)

(72) Inventors: Shikang Wang, Chengdu (CN); Fangmao Han, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 177 days.

(21) Appl. No.: 17/341,914

(22) Filed: Jun. 8, 2021

(65) Prior Publication Data

US 2021/0384611 A1     Dec. 9, 2021

(30) Foreign Application Priority Data

Jun. 9, 2020   (CN) .......................... 202010518885.X

(51) Int. Cl.
*H01Q 1/22*     (2006.01)
*H01Q 1/38*     (2006.01)
(Continued)

(52) U.S. Cl.
CPC ............. *H01Q 1/2291* (2013.01); *H01Q 1/38* (2013.01); *H01Q 1/42* (2013.01); *H01Q 1/526* (2013.01);
(Continued)

(58) Field of Classification Search
CPC .......... H01Q 1/2291; H01Q 1/38; H01Q 1/42; H01Q 1/526; H01Q 1/24; H04W 88/08;
(Continued)

(56) References Cited

U.S. PATENT DOCUMENTS 6,861,731 B2    3/2005   Buijsman et al.
2002/0167060 A1  11/2002  Buijsman et al.
(Continued)

FOREIGN PATENT DOCUMENTS

CN    1457535 A    11/2003
CN   102883583 A     1/2013
(Continued)

OTHER PUBLICATIONS

Mao Rui, "New Antenna Structure Design based on Mobile Phone Shield-Can," Communications Technology, vol. 51 No. 11, Nov. 2018, with an English abstract, 4 pages.
(Continued)

*Primary Examiner* — David E Lotter
(74) *Attorney, Agent, or Firm* — Conley Rose, P.C.

(57) ABSTRACT

An AP device includes a lower housing, a PCB assembly, and an upper cover. The PCB assembly is located in a cavity between the upper cover and the lower housing. The PCB assembly includes a PCB, an antenna, a first device, and a second device. The antenna is fastened to an upper surface of the PCB. The first device is located on the upper surface, and a height of the first device is less than a first height threshold or a conductor structure proportion is less than a proportion threshold. The second device is located on a lower surface of the PCB, and a height of the second device is greater than the first height threshold and a conductor structure proportion is greater than the proportion threshold.

18 Claims, 4 Drawing Sheets

(51) Int. Cl.
  *H05K 1/02* (2006.01)
  *H05K 3/32* (2006.01)
  *H01Q 1/42* (2006.01)
  *H01Q 1/52* (2006.01)

(52) U.S. Cl.
  CPC ........... *H05K 1/023* (2013.01); *H05K 1/0209* (2013.01); *H05K 3/328* (2013.01); *H05K 2201/10098* (2013.01)

(58) Field of Classification Search
  CPC ................... H05K 1/023; H05K 3/328; H05K 2201/10098; H05K 1/18; H04Q 1/028; H04Q 1/035; H04Q 1/116
  See application file for complete search history.

(56) References Cited

U.S. PATENT DOCUMENTS

| | | |
|---|---|---|
| 2010/0171678 A1 | 7/2010 | Mao |
| 2012/0044655 A1* | 2/2012 | Nichols ................ H05K 3/1216 361/748 |
| 2014/0085152 A1 | 3/2014 | Klemmensen et al. |
| 2014/0218255 A1* | 8/2014 | Sanford ................ H01Q 15/16 343/837 |
| 2015/0109750 A1 | 4/2015 | Elkaslassy et al. |
| 2015/0381229 A1* | 12/2015 | Tzanidis .............. H01Q 9/0457 455/73 |
| 2017/0317408 A1 | 11/2017 | Hamada et al. |
| 2019/0104640 A1* | 4/2019 | Chang ................... H05K 1/144 |
| 2019/0191597 A1 | 6/2019 | Han et al. |
| 2020/0058606 A1 | 2/2020 | Tsai et al. |
| 2021/0100065 A1* | 4/2021 | Lee ...................... H05K 7/2039 |

FOREIGN PATENT DOCUMENTS

| | | |
|---|---|---|
| CN | 203233433 U | 10/2013 |
| CN | 106207492 A | 12/2016 |
| CN | 107453026 A | 12/2017 |
| CN | 110212785 A | 9/2019 |
| CN | 110890352 A | 3/2020 |
| CN | 210129978 U | 3/2020 |
| WO | 2019236523 A1 | 12/2019 |

OTHER PUBLICATIONS

Weihong, L., "Optimized Design of Efficient Heat Dissipation Structure in PCB Board Level Circuit," Semiconductor Optoelectronics, vol. 39, No. 5, Oct. 2018, with an English abstract, 5 pages.

* cited by examiner

ASSEMBLY METHOD AND AP DEVICE

CROSS-REFERENCE TO RELATED APPLICATION

This application claims priority to Chinese Patent Application No. 202010518885.X, filed on Jun. 9, 2020, which is hereby incorporated by reference in its entirety.

TECHNICAL FIELD

This application relates to the field of wireless communications, and in particular, to an assembly method and an AP device.

BACKGROUND

A wireless local area network (WLAN) implements wireless communication by using a radio frequency (RF) technology. An intermediate device, for example, an access point (AP) device, needs to be disposed in a WLAN architecture. As a bridge connecting a wired network and a wireless network, the AP device is configured to connect wireless network clients together and enable the wireless network to access the Ethernet in the wired network.

The AP device includes several hardware structures such as an antenna board, a printed circuit board (PCB), and a housing. In order to ensure RF interconnection between the antenna board and the PCB, during assembling, a radio frequency coaxial cable with connector that is connected to an antenna and that is on the antenna board needs to be connected to a radio frequency connector on the PCB through plugging. A plug and assembly process requires a manual operation. If there are a large quantity of antennas, the PCB needs to be flipped over for a plurality of times. As a result, an antenna connection process is complex and error-prone.

SUMMARY

According to an assembly method and an AP device provided in this application, antennas can be integrated on a PCB. This avoids assembling the antenna manually and improves efficiency.

To achieve the foregoing objectives, the following technical solutions are used in this application.

According to a first aspect, this application provides an AP device, including a lower housing, a printed circuit board PCB assembly, and an upper cover. The PCB assembly is located in a cavity between the upper cover and the lower housing. The PCB assembly includes a PCB, an antenna, a first device, and a second device. The antenna is fastened to an upper surface of the PCB, and the upper surface is a surface that is of the PCB and that is close to the upper cover. The first device is located on the upper surface, and a height of the first device is less than a first height threshold or a conductor structure proportion is less than a proportion threshold. The second device is located on a lower surface of the PCB, the lower surface is a surface that is of the PCB and that is close to the lower housing, and a height of the second device is greater than the first height threshold and a conductor structure proportion is greater than the proportion threshold.

In this way, the antenna is directly fastened to the upper surface of the PCB, to implement a radio frequency connection between the antenna and the PCB. This overcomes the following problem in some approaches that in an AP device assembly process, low efficiency is caused because a radio frequency connection between an antenna and a PCB needs to be implemented through plugging a radio frequency coaxial cable with connector connected to the antenna into a radio frequency connector, and can implement fully automated assembly.

In addition, the devices are discretely distributed and fastened on the upper and lower surfaces of the PCB, to prevent heat sources from being concentrated and leading to an excessively high local temperature. This ensures effective heat dissipation of the devices. Further, a device that has a relatively high height and a relatively large conductor structure proportion and that causes relatively large radiation is isolated from the antenna. The device and the antenna are separately distributed on two sides of the PCB, to reduce an impact of radiation of the device on an antenna signal.

In a possible implementation, the PCB assembly further includes a shielding cover. A height from a top of the antenna to the upper surface of the PCB is a first height, a height from a top of the shielding cover to the upper surface of the PCB is a second height, and a difference between the first height and the second height is greater than a second height threshold. The shielding cover is fastened to the upper surface of the PCB, and the first device is located in a cavity between the shielding cover and the PCB.

The shielding cover is configured to reduce an impact of radiation of the first device located on the upper surface of the PCB on an antenna signal. Further, because a material of the shielding cover may alternatively be a conductor material, for example, sheet metal, it further needs to be ensured that a distance between the shielding cover and the top of the antenna is greater than a specific threshold, to reduce an impact of the shielding cover on signal receiving and sending of the antenna.

In a possible implementation, the first height is $(17\pm0.5)$ mm, and the second height is $(5\pm0.5)$ mm.

An implementable height design is provided. In this way, through height limitation, proper arrangement of space between the antenna, the shielding cover, and the first device on the upper surface of the PCB is ensured, and an impact on signal receiving and sending of the antenna is avoided.

In a possible implementation, the PCB assembly further includes a network port connector. The network port connector is perpendicular to the lower surface of the PCB.

The AP device should further include a network port connector for plugging a network cable, to convert a wired network into a wireless network. In some approaches, a network port connector is located on a PCB, and parallel to the PCB, and is installed in a side-out manner. A shape of the PCB needs to be changed, so that the network port connector comes out from a side of the AP device.

In this embodiment of this application, an installation manner in which the network port connector is perpendicular to the lower surface of the PCB is used, so that the network port connector comes out from the back of the PCB, and the shape of the PCB does not need to be changed. This saves layout space of the surface of the PCB, and lays a foundation for providing a proper layout for devices fastened on the surface of the PCB.

Correspondingly, a via should be disposed in the lower housing, so that the network port connector can pass through the via, and the network port connector can come out from the back of the AP device.

In a possible implementation, the antenna is connected to the PCB through welding.

In this way, the antenna is directly connected to the PCB through welding, to implement an RF connection.

In a possible implementation, the shielding cover is connected to the PCB in any one of the following connection manners, welding, press-fitting, and clamping.

According to a second aspect, this application provides a method of assembling the AP device in the first aspect. The method includes the following steps, fastening the PCB assembly to the lower housing; and assembling the upper cover and the lower housing, so that the PCB assembly is located in the cavity between the upper cover and the lower housing.

In addition, for technical effects of the method of assembling the AP device in the second aspect, refer to technical effects of the AP device in the first aspect. Details are not described herein again.

DESCRIPTION OF EMBODIMENTS

The following describes technical solutions in embodiments of this application with reference to accompanying drawings in the embodiments of this application. In descriptions of the embodiments of this application, it should be understood that a direction or position relationship indicated by terms such as "upper", "lower", "top", "bottom", "inner", and "outer" is a direction or a position relationship shown based on the accompanying drawings, is merely used to describe the present disclosure and simplify the descriptions, but is not intended to specify or imply that an indicated apparatus or element needs to have a particular direction, needs to be constructed in the particular direction, and needs to be operated in the particular direction, and therefore cannot be construed as a limitation on the present disclosure.

First, the following describes an AP device in the embodiments of this application. The AP device may include, for example, a Wi-Fi AP device.

The AP device may include an indoor AP device and an outdoor AP device. Generally, an AP networking mode may be classified into a fit AP mode and a fat AP mode. The fit AP mode is mainly used in a scenario with a high communication requirement. An AP device in the fit AP mode is usually a wireless gateway or bridge, cannot work independently, and needs to cooperate with management of a wireless controller to form a complete system. During authentication, the fit AP usually needs to cooperate with an authentication server or a switch that supports an authentication function. The Fat AP mode is mainly used in a home network and a small-sized network. An AP device in the fat AP mode is usually a wireless router that has a comprehensive function and can perform a configuration of the wireless router. Generally, one AP device can implement functions such as access, authentication, routing, a virtual private network (VPN), address translation, and even a firewall.

Figure 1:
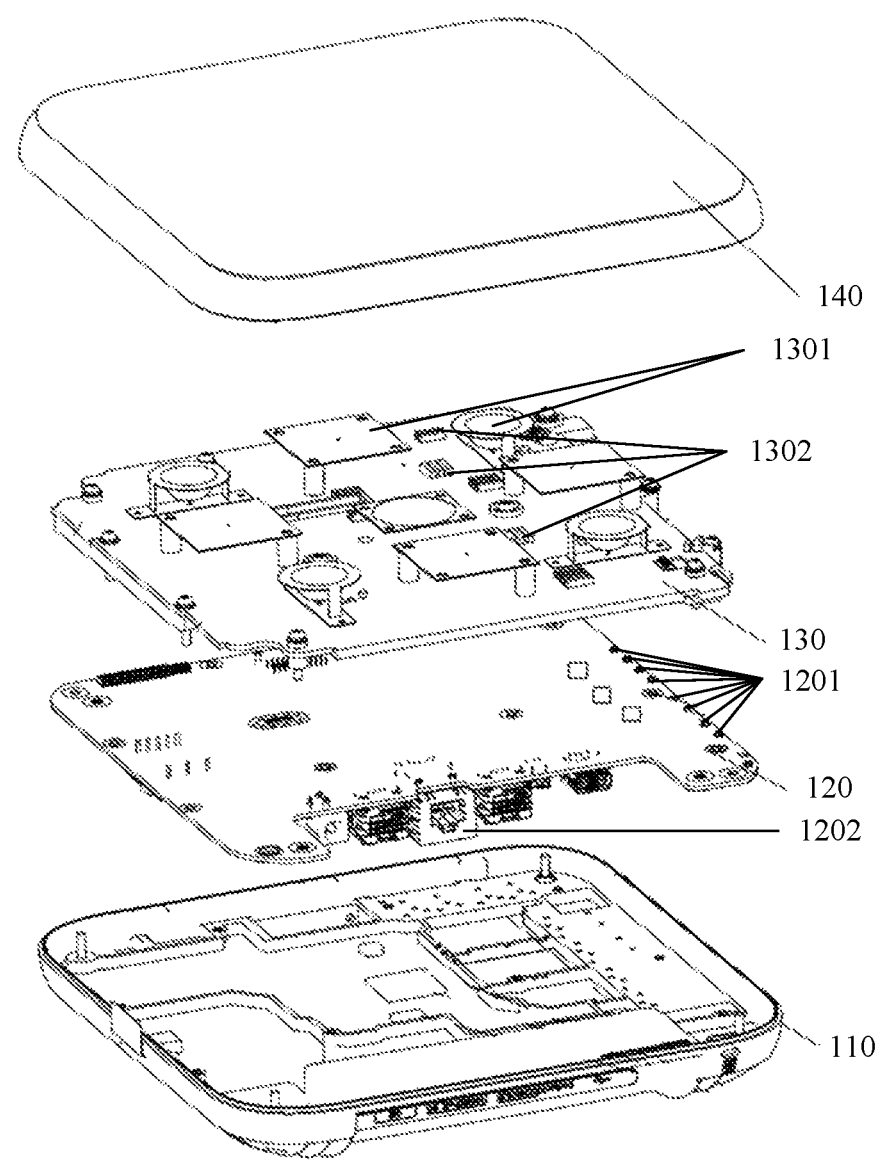
FIG. 1 is a schematic structural diagram of an AP device in some approaches according to an embodiment of this application.

Hardware structures included in AP devices in different scenarios and different networking modes are similar. Before a specific solution of this application is described, a structure of an AP device in some approaches is first explained and described. FIG. 1 is an assembly diagram of an AP device in some approaches. As shown in FIG. 1, the existing AP device mainly includes four parts of hardware structures, a lower housing 110, a PCB 120, an antenna board 130, and an upper cover 140.

During assembling, a radio frequency coaxial cable with connector (not shown in FIG. 1) that is on the antenna board 130 and that is connected to an antenna 1301 needs to be manually fastened by using a radio frequency coaxial cable with connector card slot 1302, and then be correspondingly plugged into a radio frequency connector 1201 that is fastened on the PCB 120. Then, the upper cover 140 and the lower housing 110 are assembled, so that the antenna board 130 and the PCB 120 formed through plugging are located in a cavity formed after the upper cover 140 and the lower housing 110 are assembled.

Therefore, the structure of the AP device has at least the following problems, first, the radio frequency coaxial cable with connector and the radio frequency connector need to be manually plugged, which is inefficient, costly, and error-prone. Second, if there are a relatively large quantity of antennas, plugging needs to be performed for a plurality of times, so that the radio frequency coaxial cable with connector can be plugged into the radio frequency connector. During plugging, the PCB needs to be flipped over for a plurality of times. This affects efficiency.

Figure 2:
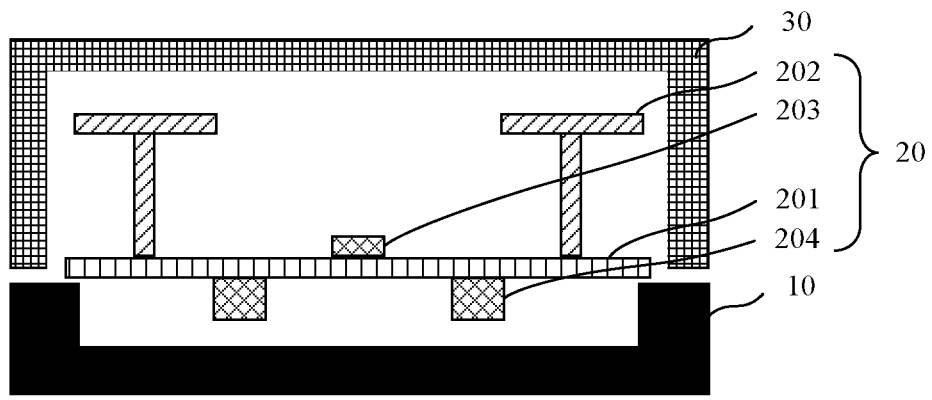
FIG. 2 is a schematic structural diagram 1 of an AP device according to an embodiment of this application.

Based on this, an embodiment of this application provides an AP device. FIG. 2 is a schematic sectional diagram of the AP device according to this embodiment of this application. As shown in FIG. 2, the AP device includes a lower housing 10, a PCB assembly 20, and an upper cover 30. The PCB assembly 20 includes a PCB 201, an antenna 202, a first device 203, and a second device 204. The PCB assembly 20 is located in a cavity between the upper cover 30 and the lower housing 10.

In this way, the antenna 202 is directly fastened to an upper surface of the PCB 201, to implement a radio frequency connection between the antenna 202 and the PCB 201. This overcomes the following problem in some approaches, in an AP device assembly process, low efficiency is caused because a radio frequency connection between an antenna and a PCB needs to be implemented through plugging a radio frequency coaxial cable with connector connected to the antenna into a radio frequency connector. After the antenna 202 is directly fastened to the upper surface of the PCB 201, an assembly process of the AP device can implement fully automated assembly. This improves efficiency and reduces labor costs. The upper surface of the PCB 201 is a surface close to the upper cover 30.

The antenna 202 may be directly fastened to the upper surface of the PCB 201 in a plurality of manners. For example, the antenna 202 is connected to the PCB 201 through welding. In this case, a size of a welding joint of the antenna 202 on the upper surface of the PCB 201 is less than a preset threshold. A value of the preset threshold may be determined based on a contact area between the antenna 202 and the upper surface of the PCB 201, or may be determined based on an empirical value, to ensure a welding effect.

The antenna 202 may be an antenna in three Wi-Fi frequency bands, 2.4G frequency band, 5G high frequency band, and 5G low frequency band. The antenna 202 may alternatively be an antenna in two Wi-Fi frequency bands, 5G high frequency band and 5G low frequency band. The antenna 202 may alternatively be a narrowband internet of things (NB-IoT) antenna or another antenna.

In addition, a device welded on the PCB 201 in the PCB assembly 20 may include the first device 203 and the second device 204. The first device 203 is located on the upper surface of the PCB 201, and a height of the first device 203 is less than a first height threshold or a conductor structure proportion is less than a proportion threshold. The second device 204 is located on a lower surface of the PCB 201, and a height of the second device 204 is greater than the first height threshold or a conductor structure proportion is greater than the proportion threshold. The lower surface of the PCB 201 is a surface close to the lower housing 10. The first height threshold and the proportion threshold may be empirical values learned in advance, for example, experimental values. The conductor structure proportion is a proportion of a part whose material is a conductor to a total structure of a device. For example, some devices are ceramic devices in which a specific proportion of metal powder is mixed. In this case, a conductor structure proportion is a proportion of the metal powder.

Because radiation emitted by a conductor substance included in a device affects an antenna signal, the device needs to be discretely arranged, to reduce an impact of the radiation of the device on the antenna signal. For example, a low device and an antenna are arranged on the same side, to prevent a high device from being too close to the antenna. If the high device is too close to the antenna, relatively large radiation affects an antenna signal. For another example, a device with a relatively small conductor structure proportion and an antenna are arranged on the same side, to reduce an impact of conductor radiation on an antenna signal.

Further, the devices on the PCB 201 are discretely distributed, to prevent heat sources from being concentrated and leading to an excessively high local temperature. This ensures effective heat dissipation of the devices. The second device 204 whose height is greater than the first height threshold and whose conductor structure proportion is greater than the proportion threshold is fastened to the lower surface of the PCB 201. Heat dissipation efficiency is improved by using a heat dissipation structure of the lower housing 10.

The heat dissipation structure of the lower housing 10 may include, for example, reducing shielding of a cooling air duct, or may include increasing a quantity of heat sink fins on an inner surface of the lower housing 10, in other words, increasing an area of the inner surface of the lower housing 10 to improve the heat dissipation efficiency, or may include changing a material of the lower housing 10 to improve the heat dissipation efficiency. For example, a new material with a high coefficient of thermal conductivity is used. A specific type of the new material with a high coefficient of thermal conductivity is not specifically limited in this application.

It should be noted that the upper cover 30 may be a cover plate made of a plurality of materials, for example, a plastic cover plate, a plastic cover plate, and a cover plate made of plastic and glass. A material and a process of the upper cover 30 are not specifically limited in this embodiment of this application. The upper cover 30 also has a heat dissipation function, to ensure the heat dissipation efficiency when the AP device works.

However, although the devices on the PCB 201 are discretely arranged to reduce an impact of the devices on signal receiving and sending of the antenna 202, the first device 203 still affects the antenna 202 when the first device works. Therefore, referring to FIG. 3, the PCB assembly 20 further includes a shielding cover 205. The shielding cover 205 is fastened to the upper surface of the PCB 201, and the first device 203 is located in a cavity between the shielding cover 205 and the PCB 201. The shielding cover 205 shields the first device 203 located on the upper surface of the PCB 201, to shield radiation of the first device 203, so as to ensure that a signal of the antenna 202 is normal.

Figure 3:
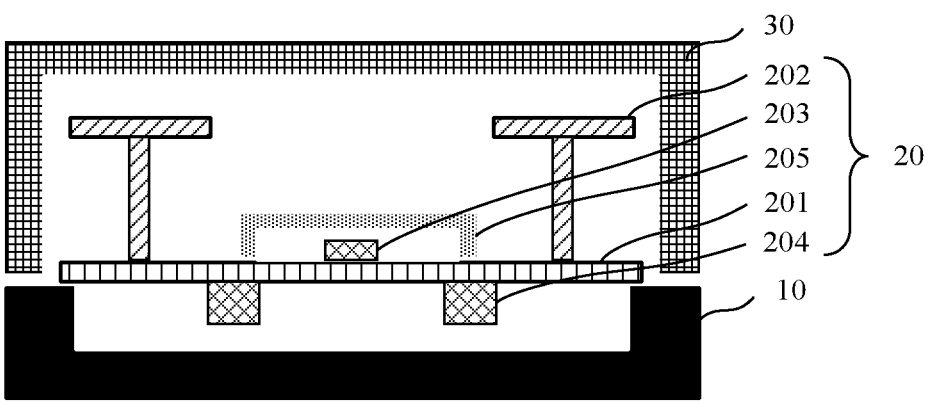
FIG. 3 is a schematic structural diagram 2 of an AP device according to an embodiment of this application.
Figure 4:
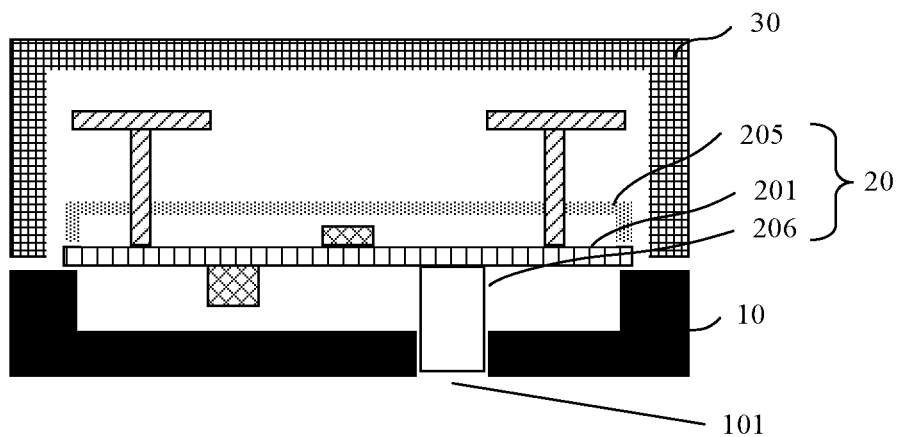
FIG. 4 is a schematic structural diagram 3 of an AP device according to an embodiment of this application.

A shape of the shielding cover 205 may be an irregular shape, and a main function of the shielding cover 205 is to isolate the first device 203. For example, as shown in FIG. 3, one or more first devices 203 share one shielding cover 205. For another example, as shown in FIG. 4, all the first devices 203 share one shielding cover 205, and it is ensured that the antenna 202 is not covered by the shielding cover 205.

It should be noted that a material of the shielding cover 205 may also be a conductor material, for example, sheet metal. Therefore, it further needs to be ensured that a distance between the shielding cover 205 and the top of the antenna 202 is greater than a specific threshold, to reduce an impact of the shielding cover 205 on signal receiving and sending of the antenna 202.

For example, a height from the top of the antenna 202 to the upper surface of the PCB 201 is set to be a first height, a height from the top of the shielding cover 205 to the upper surface of the PCB 201 is a second height, and a difference between the first height and the second height is greater than a second height threshold. The second height threshold is an empirical value learned in advance, for example, an experimental value. For example, the first height is (17±0.5) mm, and the second height is (5±0.5) mm. To be specific, a minimum distance between the shielding cover 205 and the top of the antenna 202 is 12 mm.

The shielding cover 205 is connected to the PCB 201 in any one of the following connection manners, welding, press-fitting, and clamping. For example, the shielding cover 205 is directly welded to the upper surface of the PCB 201. For another example, the shielding cover 205 and the PCB 201 are pressed to form a die casting part. For still another example, the shielding cover 205 is clamped to the upper surface of the PCB 201 by using a spring plate.

Based on this, the PCB assembly 20 is fastened to the lower housing 10, and a manner of assembling the PCB assembly 20 and the lower housing 10 may include, for example, a screw fastening manner. After the upper cover 30 and the lower housing 10 are assembled, a cavity for placing the PCB assembly 20 is formed. A manner of assembling the upper cover 30 and the lower housing 10 may include, for example, a screw fastening manner or a clamping manner. Certainly, it may be understood that each of assembly of the PCB assembly 20 and the lower housing 10 and assembly of the upper cover 30 and the lower housing 10 may further include another assembly manner, for example, a welding assembly manner.

In a possible design, as a bridge connecting a wired network and a wireless network, the AP device is configured to connect wireless network clients together and enable the wireless network to access the Ethernet in the wired network. Therefore, the AP device should further include a network port connector for plugging a network cable, to convert the wired network into the wireless network.

In some approaches, as shown in FIG. 1, a network port connector 1202 is located on the PCB 120. The network port connector 1202 is generally installed in a side-out manner. In other words, the network port connector 1202 is installed by coming out from a side of the AP device. In this case, as shown in FIG. 1, a shape of the PCB 120 needs to be changed, so that the network port connector 1202 is parallel to the PCB 120. However, changing of the shape of the PCB 120 reduces an area of the PCB 120 and causes that a quantity of bearable devices on the PCB 120 reduces. Alternatively, a device layout is limited, and a distance between devices is reduced. This affects heat dissipation.

Based on this, as shown in FIG. 4, the PCB assembly 20 in this embodiment of this application further includes a network port connector 206. The network port connector 206 is perpendicular to the lower surface of the PCB 201. A via 101 is disposed on the bottom of the lower housing 10, and the network port connector 206 passes through the via 101. To be specific, the network port connector 206 is installed in a back-out manner, and a shape of the PCB 201 does not need to be changed. This saves layout space of the surface of the PCB 201, and lays a foundation for providing a proper layout for the devices fastened on the surface of the PCB 201.

Figure 5:
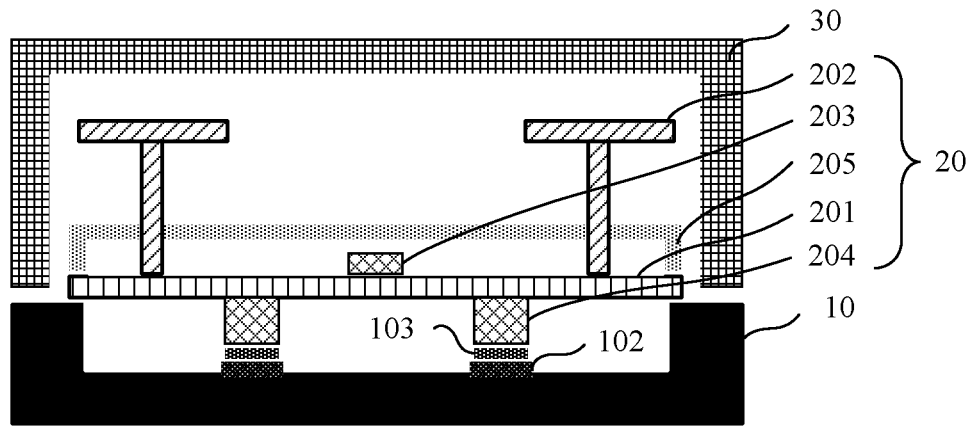
FIG. 5 is a schematic structural diagram 4 of an AP device according to an embodiment of this application.

In a possible design, as shown in FIG. 5, a boss 102 is disposed on the inner surface of the lower housing 10, an upper surface of the boss 102 is coated with a thermal gel 103, and the boss 102 contacts with the second device 204 through the thermal gel 103.

The thermal gel 103 is configured to dissipate heat for the second device 204. A material and a model of the thermal gel 103 are not specifically limited in this embodiment of this application. In this way, the boss 102 is disposed on the inner surface of the lower housing 10, to further enhance heat dissipation of the AP device, improve working efficiency, and prolong a service life.

Figure 6:
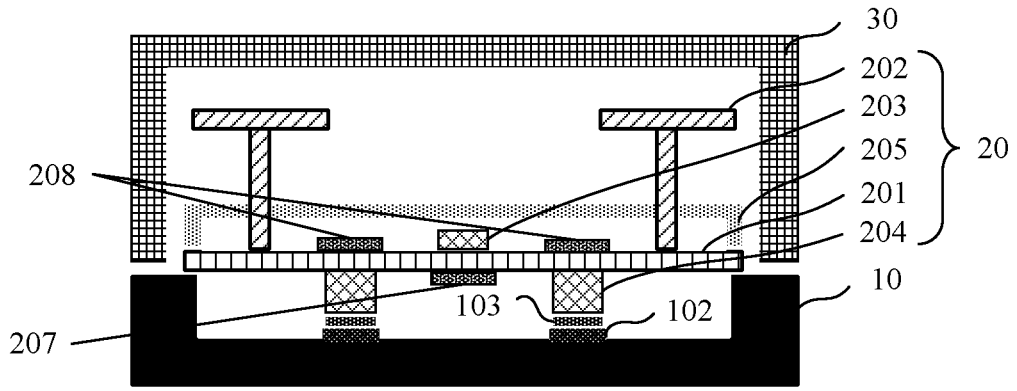
FIG. 6 is a schematic structural diagram 5 of an AP device according to an embodiment of this application.

In a possible design, as shown in FIG. 6, a first thermal pad 207 and a second thermal pad 208 are further fastened on the surface of the PCB 201. The first thermal pad 207 is located on the lower surface of the PCB 201, and is opposite to the first device 203. The second thermal pad 208 is located on the upper surface of the PCB 201, and is opposite to the second device 204. The first thermal pad 207 and the second thermal pad 208 are configured to dissipate heat for the first device 203 and the second device 204. Materials and models of the first thermal pad 207 and the second thermal pad 208 are not specifically limited in this embodiment of this application.

It should be noted that the AP device should further include an antenna clearance area, to ensure that the antenna 202 works normally. As shown in FIG. 6, the antenna clearance area is formed between the top of the antenna 202 and the upper cover 30. A size of the antenna clearance area is adjusted by controlling a distance between the top of the antenna 202 and the upper cover 30. For example, a height from the outer surface of the upper cover 30 to the top of the antenna 202 is (5±0.5) mm.

Figure 7:
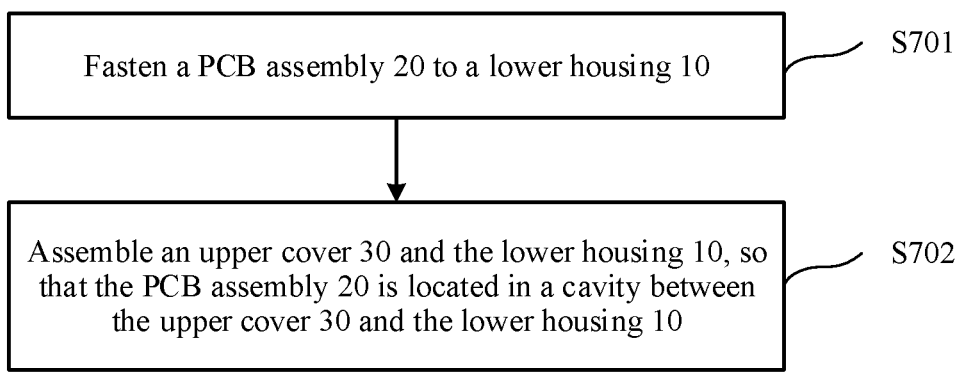
FIG. 7 is a schematic diagram of an assembly method according to an embodiment of this application.

An embodiment of this application further provides a method for assembling the foregoing AP device. As shown in FIG. 7, the method includes the following steps S701 and S702.

S701. Fasten the PCB assembly 20 to the lower housing 10.

The PCB assembly 20 is fastened to the lower housing 10 in an assembly manner of screw fastening.

S702. Assemble the upper cover 30 and the lower housing 10, so that the PCB assembly 20 is located in the cavity between the upper cover 30 and the lower housing 10.

The upper cover 30 and the lower housing 10 are assembled in an assembly manner of screw fastening or clamping.

Therefore, the embodiments of this application provide the AP device and the method of assembling the AP device. The antenna is directly fastened to the PCB, to implement a radio frequency connection. This avoids plugging the radio frequency coaxial cable with connector and the radio frequency connector manually. Further, an assembly process of the AP device can implement fully automated assembly. This improves efficiency and reduces labor costs.

In addition, based on the foregoing description of the structure of the AP device, it can be learned that before step S701, the lower housing 10 and the PCB assembly 20 in the AP device need to be further preprocessed. The preprocessing process includes the following step 1 to step 5.

Step 1, fasten the first device 203 and the second device 204 to the PCB 201.

Figures 8A, 8B:
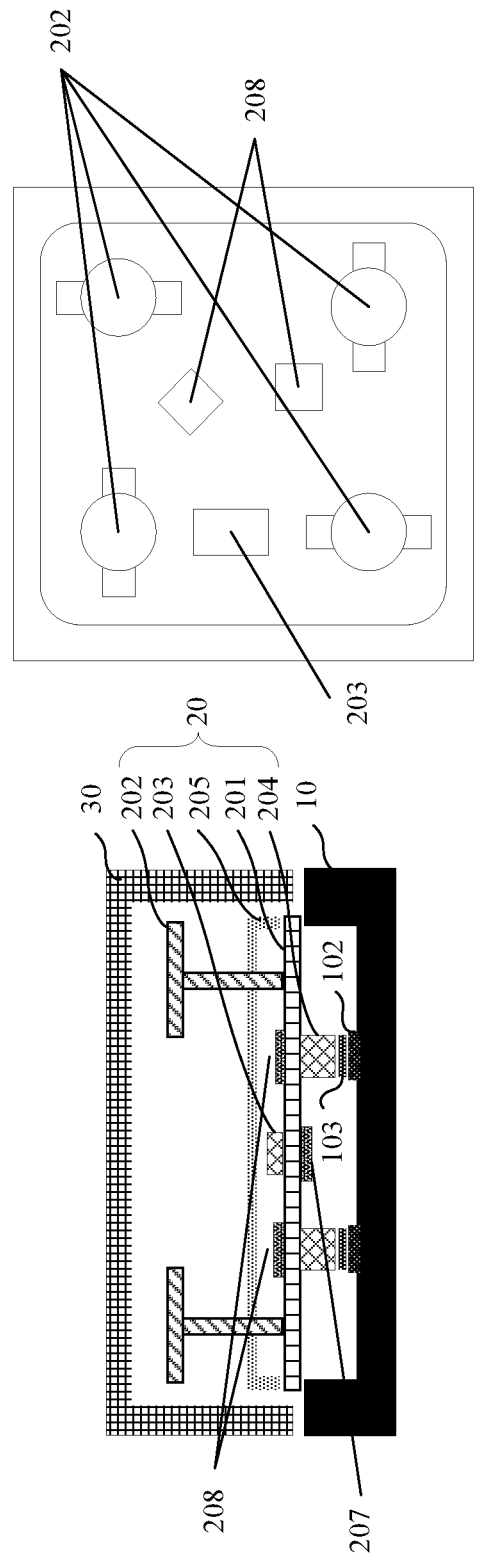
FIG. 8A and FIG. 8B are a schematic structural diagram 6 of an AP device according to an embodiment of this application.

For example, as shown in FIG. 8A, based on a specific circuit design of the PCB 201, the first device 203 is welded to the upper surface of the PCB 201, and the second device 204 is welded to the lower surface of the PCB 201.

For example, specific welding manners of the first device 203 and the second device 204 may include wave soldering and reflow soldering. This is not specifically limited in this embodiment of this application.

Step 2, fasten the antenna 202 to the PCB 201.

For example, as shown in FIG. 8A, the antenna 202 is fastened to the upper surface of the PCB 201 in a connection manner such as welding.

A specific sequence of the foregoing step 1 and step 2 is not specifically limited in this embodiment of this application. For example, step 2 may alternatively be performed before step 1.

Step 3, fasten the shield cover 205 to the PCB 201.

For example, as shown in FIG. 8A, a position at which the first device 203 is fastened on the upper surface of the PCB 201 is determined, and the shielding cover 205 is fastened on the upper surface of the PCB 201 through welding or in another manner, so that the first device 203 is located in a cavity between the shielding cover 205 and the PCB 201.

Step 4, stick the first thermal pad 207 and the second thermal pad 208 on the surface of the PCB 201.

Specifically, in a circuit design process of the PCB 201, positions at which the first device 203 and the second device 204 are fastened on the surfaces of the PCB 201 are designed, and correspondingly, a position in which a thermal pad needs to be stuck is also marked.

For example, as shown in FIG. 8A, after the sticking position is identified, the first thermal pad 207 is stick on the lower surface of the PCB 201 and at a position opposite to the first device 203. The second thermal pad 208 is stick on the upper surface of the PCB 201 and at a position opposite to the second device 204.

For example, FIG. 8B is a top view of the PCB assembly 20. Relative position relationships between the antenna 202, the first device 203, and the second thermal pad 208 can be seen. To ensure heat dissipation, devices are discretely distributed on the PCB 201.

Step 5, coat the upper surface of the boss 102 on the inner surface of the lower housing 10 with the thermal gel 103.

For example, as shown in FIG. 8A, the upper surface of the boss 102 is coated with the thermal gel 103. After the PCB assembly 20 and the lower housing 10 are subsequently assembled, the second device 204 located on the lower surface of the PCB 201 may contact with the boss 102 through the thermal gel 103, thereby implementing heat dissipation of the second device 204 through the lower housing 10. In other words, heat dissipation of a device generating much heat is implemented by performing step 5, to improve heat dissipation efficiency of the AP device.

Although this application is described with reference to the embodiments, in a process of implementing this application that claims protection, a person skilled in the art may understand and implement another variation of the disclosed embodiments by viewing the accompanying drawings, disclosed content, and the appended claims. In the claims, "comprising" does not exclude another component or another step, and "a" or "one" does not exclude a case of plurality. A single processor or another unit may implement several functions enumerated in the claims. Some measures are recorded in dependent claims that are different from each other, but this does not mean that these measures cannot be combined to produce a great effect.

Although this application is described with reference to specific features and the embodiments thereof, it is clear that various modifications and combinations may be made to this application without departing from the spirit and scope of this application. Correspondingly, the specification and the accompanying drawings are merely example descriptions of this application defined by the appended claims, and are intended to cover any of or all modifications, variations, combinations or equivalents within the scope of this application. It is clear that a person skilled in the art can make various modifications and variations to this application without departing from the spirit and scope of this application. This application is intended to cover the modifications and variations of this application, provided that they fall within the scope of the following claims and equivalent technologies of this application.

What is claimed is:

1. An access point (AP) device comprising:
   a lower housing;
   an upper cover coupled to the lower housing;
   a printed circuit board (PCB) assembly located in a first cavity between the upper cover and the lower housing wherein the PCB assembly comprises:
      a PCB comprising an upper surface proximate the upper cover and a lower surface proximate the lower housing;
      an antenna fastened to the upper surface;
      a first device on the upper surface, wherein a height of the first device is less than a first height threshold or a conductor structure proportion of the first device is less than a proportion threshold; and
      a second device on the lower surface, wherein a height of the second device is greater than the first height threshold or a conductor structure proportion of the second device is greater than the proportion threshold; and
      a shielding cover fastened to the upper surface, wherein a height from a top of the antenna to the upper surface is a first height, a height from a top of the shielding cover to the upper surface is a second height, and a difference between the first height and the second height is greater than a second height threshold, and wherein the first device is located in a second cavity between the shielding cover and the PCB.

2. The AP device of claim 1, wherein the PCB assembly further comprises a network port connector perpendicular to the lower surface of the PCB.

3. The AP device of claim 1, wherein the antenna is welded to the PCB.

4. The AP device of claim 1, wherein the shielding cover is connected to the PCB using one of, welding, press-fitting, or clamping.

5. The AP device of claim 1, wherein the first height is 17±0.5 millimeters (mm) and the second height is 5±0.5 mm.

6. A printed circuit board (PCB) assembly comprising:
   a PCB comprising an upper surface and a lower surface;
   an antenna fastened to the upper surface;
   a first device on the upper surface, wherein a height of the first device is less than a first height threshold or a conductor structure proportion of the first device is less than a proportion threshold;
   a second device on the lower surface, wherein a height of the second device is greater than the first height threshold or a conductor structure proportion of the second device is greater than the proportion threshold; and
   a shielding cover fastened to the upper surface, wherein a height from a top of the antenna to the upper surface is a first height, a height from a top of the shielding cover to the upper surface is a second height, and a difference between the first height and the second height is greater than a second height threshold, and wherein the first device is located in a cavity between the shielding cover and the PCB.

7. The PCB assembly of claim 6, wherein the shielding cover is connected to the PCB using one of, welding, press-fitting, or clamping.

8. The PCB assembly of claim 6, wherein the first height is 17±0.5 millimeters (mm) and the second height is 5±0.5 mm.

9. The PCB assembly of claim 6, wherein the PCB assembly further comprises a network port connector perpendicular to the lower surface.

10. The PCB assembly of claim 6, wherein the antenna is welded to the PCB.

11. The PCB assembly of claim 6, further comprising:
    a first thermal pad displaced between the first device and the upper surface; and
    a second thermal pad displaced between the second device and the lower surface.

12. The AP device of claim 1, further comprising:
    a first thermal pad displaced between the first device and the upper surface; and
    a second thermal pad displaced between the second device and the lower surface.

13. The AP device of claim 1, wherein the shielding cover is connected to the PCB using welding.

14. The AP device of claim 1, wherein the shielding cover is connected to the PCB using press-fitting.

15. The AP device of claim 1, wherein the shielding cover is connected to the PCB using clamping.

16. The PCB of claim 6, wherein the shielding cover is connected to the PCB using clamping.

17. The AP device of claim 1, wherein the first height is 17±0.5 millimeters (mm).

18. The AP device of claim 1, wherein the second height is 5±0.5 millimeters (mm).

* * * * *